US008637395B2

(12) United States Patent
Darnon et al.

(10) Patent No.: US 8,637,395 B2
(45) Date of Patent: Jan. 28, 2014

(54) METHODS FOR PHOTO-PATTERNABLE LOW-K (PPLK) INTEGRATION WITH CURING AFTER PATTERN TRANSFER

(75) Inventors: Maxime Darnon, Grenoble (FR); Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 12/619,298

(22) Filed: Nov. 16, 2009

(65) Prior Publication Data

US 2011/0115094 A1 May 19, 2011

(51) Int. Cl.
*H01L 21/4763* (2006.01)

(52) U.S. Cl.
USPC .................................. 438/618; 257/E21.585

(58) Field of Classification Search
USPC .................................. 257/E21.585; 438/618
See application file for complete search history.

(56) References Cited

U.S. PATENT DOCUMENTS

| | | | |
|---|---|---|---|
| 4,371,605 A | 2/1983 | Renner | |
| 5,886,102 A | 3/1999 | Sinta et al. | |
| 5,939,236 A | 8/1999 | Pavelchek et al. | |
| 6,025,260 A | 2/2000 | Lien et al. | |
| 6,087,064 A | 7/2000 | Lin et al. | |
| 6,214,719 B1 | 4/2001 | Nag | |
| 6,455,416 B1 | 9/2002 | Subramanian et al. | |
| 6,492,256 B2 | 12/2002 | Lee et al. | |
| 6,492,732 B2 | 12/2002 | Lee et al. | |
| 6,514,667 B2 | 2/2003 | Angelopoulos et al. | |
| 6,566,019 B2 | 5/2003 | Kling et al. | |
| 6,780,753 B2 | 8/2004 | Latchford et al. | |
| 6,787,469 B2 | 9/2004 | Houston et al. | |
| 6,805,109 B2 | 10/2004 | Cowan | |
| 6,861,180 B2 | 3/2005 | Chang | |
| 6,861,367 B2 | 3/2005 | Gilton et al. | |

(Continued)

FOREIGN PATENT DOCUMENTS

| | | |
|---|---|---|
| CA | 1204547 | 5/1986 |
| JP | 01293339 | 11/1989 |

OTHER PUBLICATIONS

U.S. Appl. No. 12/126,287 entitled, "Photopatternable Dielectric Materials for Beol Applications and Methods for Use", filed May 23, 2008, first named inventor: Robert D. Allen.

(Continued)

*Primary Examiner* — Howard Weiss
(74) *Attorney, Agent, or Firm* — Scully, Scott, Murphy & Presser, P.C.; Louis J. Percello, Esq.

(57) ABSTRACT

A single damascene or dual damascene interconnect structure fabricated with a photo-patternable low-k dielectric (PPLK) which is cured after etching. This method prevents the PPLK damage and the tapering of the edges of the interconnect structure. In one embodiment, the method of the present invention includes depositing a photo-patternable low-k (PPLK) material atop a substrate. The at least one PPLK material is patterned, creating a single damascene structure. For dual damascene structures, a second PPLK layer is coated and patterned. An etch process is performed to transfer the pattern from the PPLK material into at least a portion of the substrate. A diffusion liner and a conductive material can be deposited after the etch process. The resulting structure is cured anytime after etching in order to transform the resist like PPLK into a permanent low-k material that remains within the structure.

24 Claims, 4 Drawing Sheets

(56) References Cited

U.S. PATENT DOCUMENTS

| | | | |
|---|---|---|---|
| 7,012,022 B2 * | 3/2006 | Liu et al. | 438/636 |
| 7,015,137 B2 * | 3/2006 | Sakata et al. | 438/638 |
| 7,041,748 B2 | 5/2006 | Lin et al. | |
| 7,056,840 B2 | 6/2006 | Miller et al. | |
| 7,064,078 B2 | 6/2006 | Liu et al. | |
| 7,071,532 B2 | 7/2006 | Geffken et al. | |
| 7,091,611 B2 | 8/2006 | Ahn et al. | |
| 7,138,329 B2 | 11/2006 | Lur et al. | |
| 7,253,095 B2 | 8/2007 | Lur et al. | |
| 7,306,853 B2 | 12/2007 | Lin et al. | |
| 7,986,040 B2 | 7/2011 | Bartsch et al. | |
| 8,097,955 B2 | 1/2012 | Zimmermann et al. | |
| 2001/0016412 A1 | 8/2001 | Lee et al. | |
| 2002/0163082 A1 | 11/2002 | Lee et al. | |
| 2003/0073028 A1 | 4/2003 | Kim et al. | |
| 2003/0129531 A1 | 7/2003 | Oberlander et al. | |
| 2003/0198877 A1 | 10/2003 | Pfeiffer et al. | |
| 2004/0048194 A1 | 3/2004 | Breyta et al. | |
| 2004/0094821 A1 | 5/2004 | Lur et al. | |
| 2004/0151489 A1 | 8/2004 | Zhou | |
| 2005/0093158 A1 | 5/2005 | Liu et al. | |
| 2005/0263896 A1 | 12/2005 | Lur et al. | |
| 2006/0228895 A1 | 10/2006 | Chae et al. | |
| 2007/0003841 A1 | 1/2007 | Choi | |
| 2007/0020565 A1 | 1/2007 | Koh et al. | |
| 2007/0054198 A1 | 3/2007 | Park | |
| 2007/0148968 A1 | 6/2007 | Kwon et al. | |
| 2007/0212649 A1 | 9/2007 | Lalbahadoersing et al. | |
| 2007/0248899 A1 | 10/2007 | Choi | |
| 2008/0173984 A1 | 7/2008 | Lin et al. | |
| 2008/0286467 A1 | 11/2008 | Allen et al. | |
| 2009/0079075 A1 | 3/2009 | Lin et al. | |
| 2009/0079076 A1 | 3/2009 | Lin et al. | |
| 2009/0081418 A1 | 3/2009 | Allen et al. | |
| 2009/0174067 A1 | 7/2009 | Lin | |
| 2009/0233226 A1 | 9/2009 | Allen et al. | |

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

U.S. Appl. No. 12/569,200 entitled, "Patternable Low-K Dielectric Interconnect Structure With a Graded Cap Layer and Method of Fabrication ", filed Sep. 29, 2009, first named inventor: Qinghuang Lin.

U.S. Appl. No. 12/047,435 entitled, "Photopatternable Dielectric Materials for Beol Applications and Methods for Use ", filed Mar. 13, 2008, first named inventor: Robert D. Allen.

Office Action dated Feb. 26, 2013 received in a related U.S. Patent Application, namely U.S. Appl. No. 13/602,126.

Office Action dated Aug. 1, 2013 received in a related U.S. Patent Application, namely U.S. Appl. No. 13/602,126.

* cited by examiner

METHODS FOR PHOTO-PATTERNABLE LOW-K (PPLK) INTEGRATION WITH CURING AFTER PATTERN TRANSFER

FIELD OF THE INVENTION

The present invention relates to ultra-large scale integrated (ULSI) interconnect structures and a method of fabricating the same. In particular, the invention relates to a single damascene or dual damascene low-k interconnect structure fabricated with the use of a photo-patternable low-k (PPLK) material which is cured after an etch process. The uncured PPLK material is more resistant to plasma processes, and the cure process can repair any potential damage of the PPLK material.

BACKGROUND

Generally, semiconductor devices include a plurality of integrated circuits (ICs). The ICs can be useful for many applications including, but not limited to computers and electronic equipment. The ICs typically contain millions of transistors and other circuit elements that can be fabricated on a single semiconductor chip. For device functionality, a complex signal path will typically be routed to connect the circuit elements distributed on the surface of the semiconductor device. Efficient routing of these signals across the IC can become more difficult as the complexity and the number of elements in the ICs is increased. Thus, the formation of multilevel or multilayered interconnect schemes, including dual damascene, has become more desirable due to their efficacy in providing high-speed signal routing patterns between a large number of transistors on a single semiconductor chip.

In fabricating IC wiring with a multilevel interconnect scheme, an electrically insulating material (oftentimes referred to as a dielectric material or low dielectric constant dielectric material, low-k for short), such as $SiO_2$, will normally be patterned to create openings for conductive lines and/or vias using photolithography and reactive ion etching. These openings formed into the dielectric material are typically filled with an electrically conductive material such as Cu or Al to interconnect the active device regions of the ICs and to the printed circuit board. After the filling process, the semiconductor device is generally planarized by chemical-mechanical polishing. Interconnect structures of dual damascene type are highly preferred in the semiconductor industry.

The realization of conventional architectures includes the use of many layers of different patterning and masking materials (typically up to 8 different layers of materials are employed in the prior art) that are formed atop an underlying interconnect level prior to patterning. For example, a nitride hard mask, a silicon oxide hard mask, and a metal hard mask may all be used in patterning the insulating layer and the dielectric barrier of a typical interconnect structure. After forming the masking layers atop the insulating material, a photoresist and an antireflective coating are generally applied to the uppermost surface of the masking layers. The photoresist is patterned by lithography and thereafter a series of etching steps are employed to first transfer the pattern from the photoresist to an underlying ARC and each of the masking layers, and thereafter to the insulating dielectric layer and a dielectric barrier layer. Furthermore, the masking layers have to be removed after patterning. Therefore, the prior art process of patterning a dielectric material is a very inefficient process.

In recent years, conventional insulating materials such as $SiO_2$ are being phased out and replaced with dielectric materials that have a low-dielectric constant (low-k) associated therewith. The term "low-k" denotes a dielectric material that has a dielectric constant of less than 4.3. For example, various PECVD deposited inorganic dielectrics such as carbon doped organosilicates or SiCOH have been developed and are currently in the mass production of IC products. To further reduce the dielectric constant, nanoscopic pores have to be introduced into these materials to form porous low-k dielectric materials. These porous low-k dielectrics are particularly advantageous for use as an interconnect dielectric because they significantly reduce signal delay and cross-talk in interconnect structures due to their lower dielectric constants.

The patterning of low-k and porous low-k materials requires the above mentioned multilayer masking scheme. Prior art multilayer masking schemes of the type mentioned above are particularly insufficient because: (i) they need many layers of sacrificial materials; (ii) each individual masking layer needs to be removed after patterning; (iii) the various masking layers sometimes increase the effective dielectric constant of the ICs; (iv) the low-k material can be damaged during the plasma processes, and its' dielectric constant is often increased; and (v) they increase integration complexity and manufacturing costs (i.e., a need for separate photoresists and hardmasks and the related expensive deposition and etching tools).

In the prior art, some photo-patternable low-k (PPLK) materials have been proposed, see, for example, U.S. Pat. No. 7,306,853. The integration of a PPLK material in an interconnect structure typically requires the deposition of a dielectric barrier on a substrate. Then, an antireflective (ARC) layer is formed on top of the barrier layer. In some cases, the dielectric barrier can also play the role of an antireflective coating. As such, a separate ARC is not needed in all instances. The PPLK is deposited atop of the stack, and patterned. In some cases, a second PPLK layer is deposited and patterned to form dual damascene interconnect structures. The PPLK layer(s) is/are cured in order to convert it from a resist-like material into a permanent low-k material that remains within the interconnect structure. An etch process is used to open the ARC and the dielectric barrier. A metal liner and an electrically conductor (typically TaN and copper) are deposited and are polished by chemical mechanical polishing.

With such a PPLK integration scheme, the ARC and cap layer are etched after conversion of the PPLK from a resist into a permanent low-k dielectric. The etch selectivity of the permanent low-k dielectric is generally lower than that of the resist-like PPLK prior to conversion. Additionally, no separate mask is used on top of the PPLK material. As a consequence, an upper portion of the PPLK material is etched, and the edges of the PPLK features can be tapered by the plasma etch process. Furthermore, the PPLK material is potentially damaged by the plasma etch process. More details on the standard integration scheme for PPLK can be found in U.S. Patent Application Publication No. 2009/0079075 A1, the entire contents of which are incorporated herein by reference.

In view of the state of the art mentioned hereinabove, there is a continued need for providing interconnects structures which prevent the use of sacrificial layers, while improving etch selectivity and keeping an undamaged interconnect dielectric.

SUMMARY

The present invention provides a single damascene or dual damascene interconnect structure fabricated with a photo-patternable low-k dielectric (PPLK) material. The conversion of the PPLK from resist-like material into a permanent low-k material (hereafter referred to as cure) is performed after etching. This interconnect fabrication method improves etch selectivity and prevents PPLK damage. Moreover, the method provides an interconnect structure including at least one conductively filled region located within a patterned and cured reaction product of the PPLK material that has an inflection point at a lower region of an PPLK pattern that is in proximity to an upper surface of a substrate underlying the patterned and cured PPLK material. Moreover, the interconnect pattern also has an upper region that has substantially straight sidewalls. By "inflection point" it is meant that the profile (or the sidewall) of the patterned and cured PPLK exhibits a sudden change in curvature due to the material shrinkage of the patterned PPLK during cure. By substantially "straight sidewalls" it is meant that the sidewall of the patterned and cured PPLK is close to 90° relative to the substrate surface.

Broadly, the method of the present invention includes depositing at least one photo-patternable low-k (PPLK) material atop an initial substrate. The initial substrate can include a dielectric cap, an antireflective coating (ARC), or a material stack including the same or additional device or interconnect layers. The at least one PPLK material is patterned by lithographic methods to form at least one opening. An etch is performed to transfer the at least one opening into the ARC and dielectric cap layer. A subsequent cure is carried out to create a single damascene structure with an inflection point in pattern profile of the patterned and cured PPLK. For dual damascene structures, a second PPLK layer is coated and patterned. An etch process is performed to transfer the pattern for the PPLK material into at least a portion of the substrate, typically into the dielectric cap and/or ARC, using processes known by those skilled in the art (typically fluorocarbon-based reactive ion etching). A diffusion liner deposition can follow the etch process. An electrically conductive material can also be deposited. The diffusion liner and the electrically conductive material can be polished using chemical mechanical polishing. The resulting structure is cured anytime after etching order to transform the resist like PPLK into a permanent low-k material that remains within the structure.

In one embodiment of the invention, a method of forming a single damascene interconnect structure is provided. In this embodiment of the invention, the method includes providing at least one photo-patternable low-k (PPLK) material an upper surface of a substrate. The substrate may include a dielectric cap, an antireflective coating (ARC) or a material stack thereof. At least one interconnect pattern is formed into the at least one PPLK material providing at least one patterned PPLK material. This step is performed without utilizing a separate photoresist. The at least one interconnect pattern from the at least one patterned PPLK material is transferred into a portion of the substrate prior to the conversion of the PPLK into a patterned permanent low-k dielectric, typically, to at least one of the dielectric cap and ARC. Curing is performed that converts the at least one patterned PPLK material into a patterned and cured PPLK dielectric material and maintains pattern integrity. The patterned and cured PPLK material remains as a permanent interconnect dielectric material within the structure.

In another embodiment of the invention, a method of forming a dual damascene interconnect structure is provided. This method includes forming a first photo-patternable low-k (PPLK) material on an upper surface of a substrate. The substrate may include a dielectric cap, an antireflective coating (ARC) or a material stack thereof. At least one first interconnect pattern is formed into the first PPLK material providing a first patterned PPLK material. This is achieved without utilizing a separate photoresist. This first PPLK pattern can be frozen by, for example, a cure process. A second PPLK material is formed within the at least one first interconnect pattern and atop the first patterned PPLK material. At least one second interconnect pattern is formed within the second PPLK material providing a second patterned PPLK material and recovering the first pattern in the first PPLK material. This is also achieved without the use of a separate photoresist. At least the first interconnect pattern is transferred into at least a portion of the substrate, typically, into at least one of dielectric cap and ARC. Curing is performed which converts the first patterned PPLK material and the second patterned PPLK material into first and second patterned and cured PPLK materials, respectively, and maintains pattern integrity of the first and the second patterns. The first and second patterned and cured PPLK materials remain as permanent interconnect dielectric materials within the structure.

The present invention also provides an interconnect structure made from the above mentioned methods. In one embodiment, the interconnect structure includes at least one patterned and cured low-k material located directly on a surface of a substrate. The at least one patterned and cured low-k material is a cured product of a photo-patternable low-k material comprising a functionalized polymer, copolymer, or a blend including at least two of any combination of polymers and/or copolymers having one or more photo/acid-sensitive imageable groups. The interconnect structure further includes at least one least one electrically conductively filled region embedded within an interconnect pattern located within the at least one patterned and cured low-k material. The at least one conductively filled region has an inflection point at a lower region of the interconnect pattern that is in proximity to an upper surface of the substrate and the interconnect pattern has an upper region that has substantially straight sidewalls.

Single and dual damascene structures having the above features are disclosed.

DETAILED DESCRIPTION

The present invention, which provides a single damascene or dual damascene interconnect structure fabricated with a photo-patternable low-k dielectric (PPLK) material, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention will now be described in greater detail by referring to FIGS. 1-6 which illustrate the basic processing steps that can be employed in one embodiment of the invention. In the illustrated embodiment of FIGS. 1-6 a single damascene interconnect structure is formed. The single damascene structure that is formed includes at least one conductively filled region located within a patterned and cured PPLK material that has an inflection point at a lower region of an interconnect pattern that is in proximity to an upper surface of a substrate underlying the patterned and cured PPLK material. The interconnect pattern also has an upper region with substantially straight sidewalls.

Figure 1:
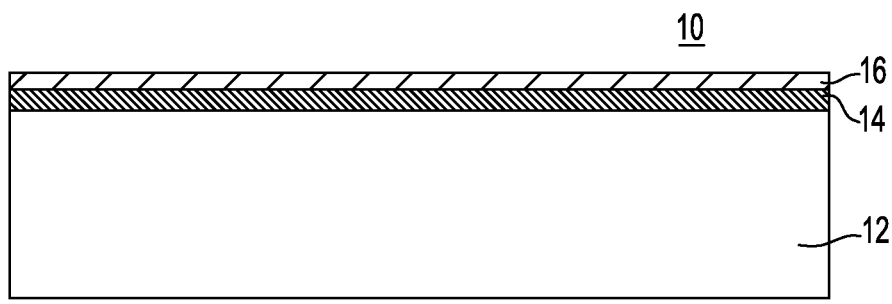
FIG. 1 is a pictorial representation (through a cross section view) illustrating an initial structure that can be employed in one embodiment of the present application.

Reference is first made to FIG. 1 which illustrates an initial structure 10 that can be employed in the present application. The initial structure 10 includes a substrate 12, an optional dielectric cap 14 located on an upper surface of substrate 12, and an optional ARC 16 located on an upper surface of the optional dielectric cap 14. In embodiments in which the optional dielectric cap 14 is not present, the ARC 16 would be located on an upper surface of substrate 12.

The substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The substrate 12 can also include a PPLK material described herein below. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride or combinations thereof including multilayers.

When present, the optional dielectric cap 14 is formed directly on the surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The optional dielectric cap 14 comprises any suitable dielectric capping material such as, for example, SiC, SiN, $SiO_2$, a carbon doped oxide, a nitrogen and hydrogen doped silicon carbide SiC(N,H) or multilayers thereof. The optional dielectric cap 14 can be a continuous layer or a discontinuous layer. The optional dielectric cap 14 can be a layer with graded composition in the vertical direction. It can also be a select cap, such as CoWP.

A post deposition treatment may be applied to the optional dielectric cap 14 to modify the properties of either the entire layer or the surface of the optional dielectric cap. This post deposition treatment can be selected from heat treatment, irradiation of electromagnetic wave (such of ultra-violet light), particle beam (such as an electron beam, or an ion beam), plasma, treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the dielectric cap, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming the optional dielectric cap 14.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present invention: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the optional dielectric cap 14.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the optional dielectric cap 14.

The post deposition chemical treatment may be conducted in a gas phase or a liquid phase. The following conditions may be employed for this aspect of the present invention: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire dielectric cap 14 or is limited only to the surface of the dielectric cap 14. Example chemicals include adhesion promoters such as silanes, siloxanes and silylation agents. This treatment step may or may not be performed in the same tool as that used in forming the optional dielectric cap 14.

The thickness of the optional dielectric cap 14, when present, may vary depending on the technique used to form the same as well as the material make-up of the layer. Typically, the dielectric cap 14 has a thickness from 5 nm to 55 nm, with a thickness from 20 nm to 45 nm being more typical.

An antireflective coating (ARC) 16 is formed on a surface of the optional dielectric cap 14 if present, or directly on a surface of the substrate 12 when the dielectric cap 14 is not present. The ARC 16 employed has all of the following general characteristics: (i) It acts as an ARC during a lithographic patterning process; (ii) It withstands high-temperature BEOL integration processing (up to 500° C.); (iii) It prevents resist poisoning by the substrate; (iv) It provides vertical wall profile and sufficient etch selectivity between the PPLK material and the ARC layer; (v) It serves as a permanent dielectric layer in a chip (low dielectric constant, preferably k<5, more preferably k<3.6); and (vi) It is compatible with conventional BEOL integration and produces reliable hardware.

Further discussion is now provided for characteristics (i)-(v). Characteristic (i) ARC 16 acts as an antireflective coating (ARC) during a lithographic patterning process: ARC 16 may be designed to control reflection of light that is transmitted through the PPLK material, reflected off the substrate 12 and back into the PPLK material, where it can interfere with incoming light and cause the PPLK material to be unevenly exposed. The ARC's optical constants are defined here as the index of refraction n and the extinction coefficient k. In general, ARC 16 can be modeled so as to find optimum optical parameters (n and k values) of the ARC as well as optimum thickness. The preferred optical constants of ARC 16 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of ARC 16 are optimized to obtain optimal resolution, profile control and to maximize process window of the PPLK material during the subsequent patterning steps, which is well known to those ordinarily skilled in the art.

Characteristic (ii) ARC 16 can withstand high-temperature BEOL integration processing (up to 500° C.): ARC 16 must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) ARC 16 prevents the PPLK material poisoning by the substrate: The PPLK material employed herein are preferably chemically amplified resists. They can be poisoned by any basic containment from the underlying substrate, such as a SiCN cap layer 14. ARC 16 must serve as a barrier layer to prevent basic contaminant from the underlying substrate from diffusing into the PPLK material to poison the chemically amplified PPLK material.

Characteristic (iv) ARC 16 provides vertical wall profile and sufficient etch selectivity between the PPLK material and the ARC layer: ARC 16 should provide sufficient reflectivity control with reflectivity from the underlying substrate under a particular lithographic wavelength of less than 8%, preferably less than 5%, more preferably less than 2% and generate vertical side wafer profile. ARC 16 should also generate residue-free patterns with no footing. Moreover, the adhesion of the PPLK material should be sufficient to prevent pattern collapse during patterning and the subsequent UV cure. ARC 16 should also be designed such that the etch selectivity during a subsequent ARC/cap open process is sufficiently high so that the opening of the ARC/cap stack does not erode a significant portion of the PPLK material and degrade significantly its pattern profile. An etch selectivity (etch rate ratio of ARC/cap versus PPLK material) is greater than 1, preferably greater than 3, more preferable greater than 5.

Characteristic (v) ARC 16 serves as a permanent dielectric layer in a chip: ARC 16 remains after patterning and cure of the PPLK material. It serves as a permanent dielectric layer in a chip. Therefore, ARC 16 (after cure) must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (adhesion energy is equal to or greater than the cohesive energy of the weakest layer of the integrated film stack); must pass electrical and mechanical reliability tests.

The thickness of the ARC 16 may vary depending on the technique used to form the same as well as the material make-up of the layer. Typically, the ARC 16 has a thickness from 5 nm to 200 nm, with a thickness from 20 nm to 140 nm being more typical. The ARC 16 may be inorganic or a hybrid of inorganic and organic.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as ARC 16 and may be deposited, for example, by plasma-enhanced chemical vapor deposition, spin-on techniques, spray coating, dip coating, etc. ARC 16 may be a single layer or multilayer. When ARC 16 is a multilayer ARC, the deposition of each layer may be the same or a combination of deposition methods can be used. The chemical composition of ARC 16 may be uniform or graded along the vertical direction. After applying ARC 16, particularly those from a liquid phase, a post deposition baking step is usually required to remove unwanted components, such as solvent, and to effect crosslinking. The post deposition baking step of ARC 16 is typically, but not necessarily always, performed at a temperature from 80° C. to 300° C., with a baking temperature from 120° C. to 200° C. being even more typical.

In some embodiments, the as-deposited ARC 16 may be subjected to a post deposition treatment to improve the properties of the entire layer or the surface of the ARC 16. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of the ARC 16 and/or the film stack, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The conditions of the post treatments used here for ARC 16 are the same as those described above for the optional dielectric cap 14. As such, the above post treatment conditions for the optional dielectric cap 14 are incorporated herein by reference.

In one embodiment, the ARC 16 that is employed is an inorganic composition that includes elements of M, C (carbon) and H (hydrogen), wherein M is selected from at least one of the elements of Si, Ge, B, Sn, Fe, Ta, Ti, Ni, Hf and La. Such an ARC is described for example within U.S. Ser. No. 11/858,636, filed Sep. 20, 2007, now U.S. Patent Publication No. 2009/0079076 the entire content of which is incorporated herein by reference. This inorganic ARC may optionally include elements of O, N, S, F or mixtures thereof. In some embodiments, M is preferably Si. In some embodiments, the ARC composition may also be referred to as a vapor deposited M:C:H: optionally X material, wherein M is as defined above, and X is at least one element of O, N, S and F.

In such an embodiment, ARC 16 is produced by a vapor or liquid phase deposition (such as, for example, CVD, PECVD, PVD, ALD and spin-on coating) method using appropriate Si, Ge, B, Sn, Fe, Ta, Ti, Ni, Hf and La precursors by adjusting process parameters and/or precursor composition.

In a preferred embodiment, ARC 16 is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane (SiH$_4$) derivatives having the molecular formula SiR$_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Preferred Si precursors include, but are not limited to silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3,-tetrahydrido-1,3-disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4,-hexahydrido-1,4-disilabutane, and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene can be employed.

A single precursor such as silane amine, Si(Net)$_4$, can be used as the silicon, carbon and nitrogen source. Another preferred method is a mixture of precursors, a Si containing source such as silane, disilane, or an alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —[$CH_2$]$_n$—, where n is greater than or equal to 1, and may be substituted by functional groups selected from alkenes (—C=C—), alkynes (—C≡C—), amines (—C—N—), nitriles (—C≡N), amino (—$NH_2$), azido (—N=N=N—) and azo (—N=N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

In some embodiments, the method may further include the step of providing a parallel plate reactor, which has an area of a substrate chuck from 85 $cm^2$ to 750 $cm^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of ARC 16. Broadly, the conditions used for providing the ARC 16 comprising elements of Si:C:H:X, include: setting the substrate temperature within a range from 100° C. to 700° C.; setting the high frequency RF power density within a range from 0.1 $W/cm^2$ to 2.0 $W/cm^2$; setting the gas flow rates within a range from 5 sccm to 10000 sccm, setting the inert carrier gases, such as helium (or/and argon) flow rate within a range from 10 sccm to 10000 sccm; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from 10 sccm to 1000 sccm. While gas precursors are used in the above example, liquid precursors may also be used for the deposition.

The atomic % ranges for M in such ARC materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in ARC 16 are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in ARC 16 are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in ARC 16 are as follows: preferably O atomic % to 70 atomic %, more preferably 0.5 atomic % to 70 atomic %, most preferably 1 atomic % to 40 atomic % and most highly preferably 5 atomic % to 30 atomic %.

The ARC 16 including elements of M, C and H has a tunable index of refraction and extinction coefficient which can be optionally graded along the film thickness to match the optical properties of the substrate and the PPLK material. The optical properties and the lithographic features of ARC 16 are vastly superior to those obtained by the prior art.

The ARC 16 including elements of M, C and H can be deposited also in a parallel plate PECVD reactor with the substrate positioned on the grounded electrode. In some embodiments, ARC 16 can be deposited at a substrate temperature up to 400° C., and in a high-density plasma type reactor under suitable chosen conditions. It should be noted that by changing process parameters such as bias voltage, gas mixture, gas flow, pressure and deposition temperature, the film's optical constants can be changed. In addition, the composition of the starting precursor as well as the introduction of oxygen, nitrogen, fluorine, and sulfur containing precursors also allows the tunability of these films. The ARC's optical constants are defined here as the index of refraction n and the extinction coefficient k.

In another embodiment, the ARC 16 that is employed is formed by a liquid deposition process including for example, spin-on coating, spray coating, dip coating, brush coating, evaporation or chemical solution deposition. This ARC formed by liquid deposition comprises a polymer that has at least one monomer unit comprising the formula M-$R^A$ wherein M is at least one of the elements of Si, Ge, B, Sn, Fe, Ta, Ti, Ni, Hf and La and $R^A$ is a chromophore. Such an ARC is described in U.S. Patent Publication No. 2009/0081418 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the ARC 16 formed by liquid deposition may also include at least one second monomer unit, in addition to the at least one monomer unit represented by the formula M-$R^A$. When present, the at least one second monomer unit has the formula M'—$R^B$, wherein M' is at least one of the elements of Si, Ge, B, Sn, Fe, Ta, Ti, Ni, Hf and La, and $R^B$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid ARC composition comprising M-$R^A$ or M-$R^A$ and M'-$R^B$ may also comprise at least one additional component, including a separate crosslinker, an acid generator or a solvent. When liquid deposition is employed, the ARC 16 is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the ARC may optionally include elements of O, N, S, F, or mixtures thereof. In some embodiments, M is preferably Si. The liquid composition also includes, in addition to the inorganic precursor, a chromophore, a cross-linking component, an acid generator and solvent.

One embodiment of the inorganic ARC 16 composition used in the liquid deposition embodiment comprises M-$R^A$ and M'-$R^B$ units, wherein M and M' are at least one of the elements of Si, Ge, B, Sn, Fe, Ta, Ti, Ni, Hf and La or are selected from Group IIIB to Group VIB, Group IIIA, and Group IVA. The inorganic precursor used in forming the ARC may optionally include elements of O, N, S, F or mixtures thereof. One embodiment of the ARC composition comprises the $MO_y$ unit which can be any one of many different metal-oxide forms. An exemplary list of such metal-oxide forms for a particular metal is as follows: MO$_3$; wherein M is Sc, Y, lanthanide, and Group IIIA; B, Al, Ga or In; MO$_4$; wherein M is Group IVB; Ti, Zr or Hf, and Group IVA; Sn or Ge; MO$_5$; wherein M is Group VB; V, Nb or Ta; or P. The Group VB metals are also known to form stable metal oxo forms, LMO$_3$, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited ARC are defined in greater detail with respect to the following preferred embodiment of the present invention. In a preferred embodiment, the ARC 16 formed by liquid deposition is characterized by the presence of a silicon-containing polymer having units selected from a siloxane, silane, carbosilane, oxycarbosilane, silsesquioxane, alkyltrialkoxysilane, tetra-alkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should have solution and film-forming characteristics conducive to forming an ARC by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

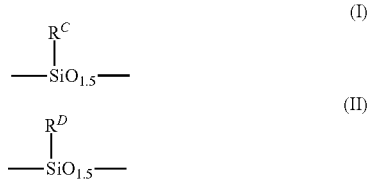

where R$^C$ comprises a chromophore and R$^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for R$^C$-containing monomers may be represented as structure (III) below and the average structure for R$^D$-containing monomers may be represented by structure (IV) below:

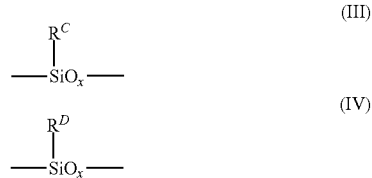

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups R$^C$ (or R$^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

R$^D$ (or R$^B$ in the generic description above) comprises a reactive site for reaction with a cross-linking component. Preferred reactive moieties contained in R$^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited ARC 16 is poly(4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly(p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly(p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in a liquid deposited ARC 16 preferably have a weight average molecular weight, before reaction with the cross-linking component, of at least 1000, more preferably a weight average molecular weight of 1000-10000.

The cross-linking component of the liquid deposited ARC 16 is preferably a crosslinker that can be reacted with an SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

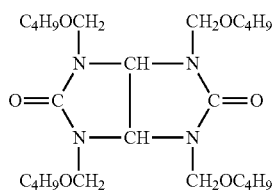

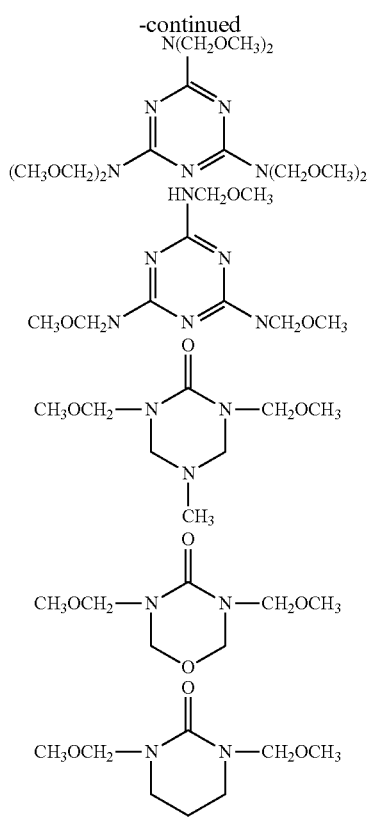

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or his-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited ARC composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939, 236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective compositions used in the liquid deposition process preferably contain (on a solids basis) (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

After liquid depositing the ARC 16, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present invention. The baked and previously liquid deposited ARC 16 may further undergo a curing process. The curing is performed in the present invention by a thermal cure, an electron beam cure, an ultra-violet (UV) cure, an ion beam cure, a plasma cure, a microwave cure or any combination thereof.

In addition, the composition of the starting precursor used in liquid deposition as well as the introduction of oxygen, nitrogen, fluorine containing precursors also allows the tunability of these films. In either embodiment mentioned above, the ARC's optical constants are defined here as the index of refraction n and the extinction coefficient k. In general, ARC 16 can be modeled so as to find optimum optical parameters (n and k values) of ARC as well as optimum thickness. The preferred optical constants of the ARC 16 are in the range from n=1.4 to n=2.6 and k=0.01 to k=0.78 at a wavelength of 248, 193 and 157, 126 nm and extreme ultraviolet (13.4 nm) radiation.

In addition to the above, ARC 16 in any embodiment does not interact with the PPLK material to induce residue, footing or undercutting. Moreover, ARC 16 has good etch selectivity to the patterned and cured PPLK material. Etch selectivities of 1.5-4 to 1 of ARC 16 to the PPLK material can be obtained. Furthermore, the use of the ARC 16 described above (vapor or liquid deposited) maintains the pattern and structural integrity after curing of the PPLK material. This is critical as ARC layer 16 is retained as a permanent part of the final interconnect stack.

In some embodiments of the invention, the optional dielectric layer 14 and the ARC 16 can be combined into a graded cap that includes properties of both a dielectric cap layer and an ARC. Such a graded cap includes at least a lower region that includes elements of a dielectric cap and an upper region that includes elements of an ARC. The graded cap can be formed utilizing any of the methods mentioned above in forming the dielectric cap and/or ARC.

Figure 2:
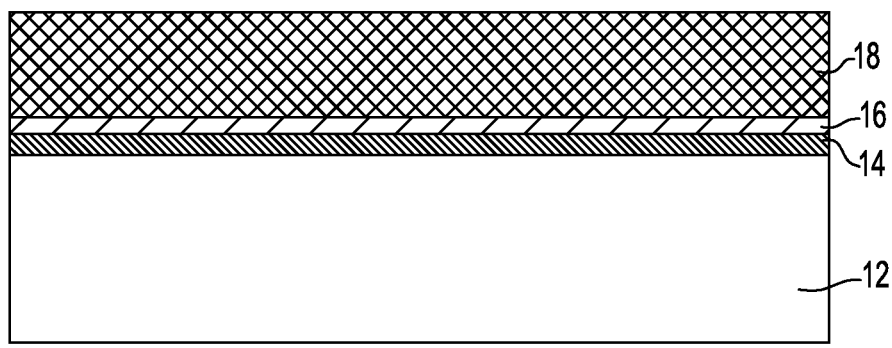
FIG. 2 is a pictorial representation (through a cross sectional view) illustrating the initial structure of FIG. 1 after forming a photo-patternable low-k (PPLK) material on an upper surface of the initial structure.

Referring now to FIG. 2, there is illustrated a PPLK material 18 that is formed on an upper surface of the initial structure 10 shown in FIG. 1. That is, the PPLK material 18 can be formed atop any of substrate 12, dielectric cap 14 or ARC 16. The PPLK material serves as a photoresist and as a permanent low-k (k of 4.3 or less) on-chip dielectric. The PPLK material 18 is provided (i.e., formed) utilizing a deposition process including, for example, spin-on-coating, dip coating, brush coating, blade coating, chemical solution deposition, and inkjet dispensing. After applying the PPLK material 18, a post deposition baking step is typically, but not necessarily always, employed to remove unwanted components, such as solvent. When performed, the baking step can be conducted at a temperature from 40° C. to 200° C., with a baking temperature from 60° C. to 140° C. being more preferred. The duration of the baking step varies from 10 seconds to 600 seconds and is not critical herein.

The thickness of the PPLK material 18 may vary depending on the requirement of the chip and the technique used to form the same as well as the material make-up of the PPLK material 18. Typically, the PPLK material 18 has a thickness from 1 nm to 50000 nm, with a thickness from 20 nm to 5000 nm being more typical.

The PPLK material 18 includes a functionalized polymer, copolymer or blend including at least two of any combination of polymers and/or copolymers having one or more acid-sensitive imageable groups. It is noted that when the PPLK material 18 is comprised of a polymer, the polymer includes at least one monomer (to be described in greater detail below). When the PPLK material 18 is comprised of a copolymer, the copolymer includes at least two monomers (to be described in greater detail below). The blends of polymers and/or copolymers include at least two of any combination of polymers and/or copolymers described below.

In general terms, the PPLK material 18 is a patternable composition comprising a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetraalkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material 18 is a patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material 18 may also be patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the PPLK material 18 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the PPLK material 18 may be a patternable composition further comprising at least one microscopic pore generator (porogen). The pore generator may be or may not be photo/acid sensitive. The pore size (diameter) should be less than 10 nm, preferably less than 5 nm, and more preferably less than 2 nm.

Illustrative polymers for the PPLK material 18 include, but are not limited to siloxane, silane, carbosilane, oxycarbosilane, silsesquioxane-type polymers including caged, linear, branched or combinations thereof. In one embodiment, the PPLK material 18 is a patternable composition comprising a blend of these photo/acid-sensitive polymers. Examples of PPLK materials that can be employed in the present disclosure include, for example, the PPLK materials disclosed in U.S. Pat. Nos. 7,041,748, 7,056,840, and 6,087,064, as well as U.S. Patent Application Publication No. 2008/0286467, U.S. Patent Application Publication No. 2009/0233226, U.S. patent application Ser. No. 12/126,287, filed May 23, 2008, U.S. patent application Ser. No. 12/569,200, filed Sep. 29, 2009. All these disclosures are incorporated herein by reference in their entirety. The dielectric constant of the PPLK material 18 after cure is generally no more than 4.3. More typically, the PPLK material 18 after cure has a dielectric constant of less than 3.9, with a dielectric constant of less than 3.5 being even more typical.

The PPLK material 18 is formed from a patternable composition (negative-tone or positive-tone) that includes at least one of the above mentioned polymers, copolymers or blends, a photoacid generator, a base additive and a solvent typically used in a photoresist composition. When the PPLK material 18 is a negative-tone patternable material, it may be formed from a patternable composition optionally including an additional cross-linker. This additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material 18 is a positive-tone patternable material, it is formed from a patternable composition that includes at least one of the above mentioned polymers, copolymers or blends, a photoacid generator, a base additive and a solvent typically used in a photoresist. The photoacid generators, base additives and solvents are well known to those skilled in the art and, as such, details regarding those components are not fully provided.

Figure 3:
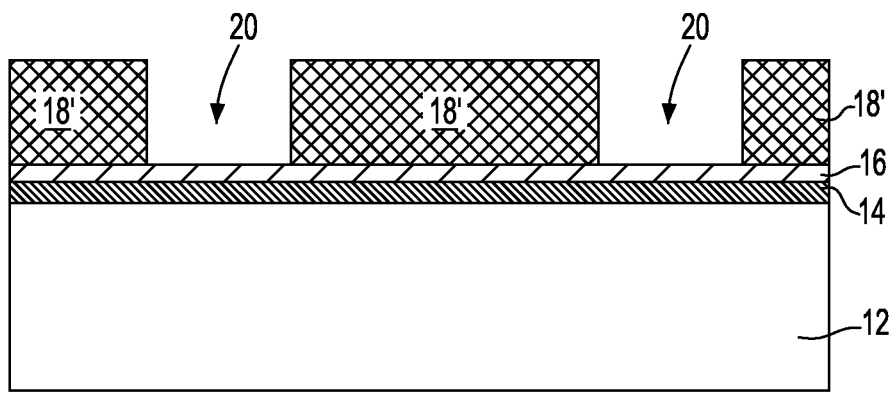
FIG. 3 is a pictorial representation (through a cross sectional view) illustrating the structure of FIG. 2 after forming at least one interconnect pattern into the PPLK material.

Referring now to FIG. 3, there is illustrated the structure of FIG. 2 after forming a patterned PPLK material 18' that includes at least one interconnect pattern 20 present therein. The at least one interconnect pattern 20 can be at least one via opening (as shown and as preferred) or at least one line opening (not shown and less preferred than forming a via opening at this stage of the inventive method). The at least one interconnect pattern 20 exposes a surface of an underlying material of the initial structure 10. That is, the at least one interconnect pattern 20 can expose a surface of ARC 16, dielectric cap 14 or substrate 12.

The at least one interconnect pattern 20 is formed within the PPLK material 18 by subjecting the PPLK material 18 to a pattern-wise exposure step that forms latent images of a desired circuitry. An optional post-exposure baking may be required to effect the photochemical reactions. When performed, the baking step is conducted at a temperature from 60° to 200° C., with a baking temperature from 80° to 140° C. being more preferred. The duration of the baking step varies and is not critical to the practice of the present invention. After exposure and post-exposure baking, the latent images are developed with an appropriate developer, usually an aqueous base solution, such as 0.26N tetramethylammoniahydroxide (TMAH) solution, to form a relief PPLK pattern.

The pattern wise exposing process can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), or an electron beam, an ion beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

Figure 4:
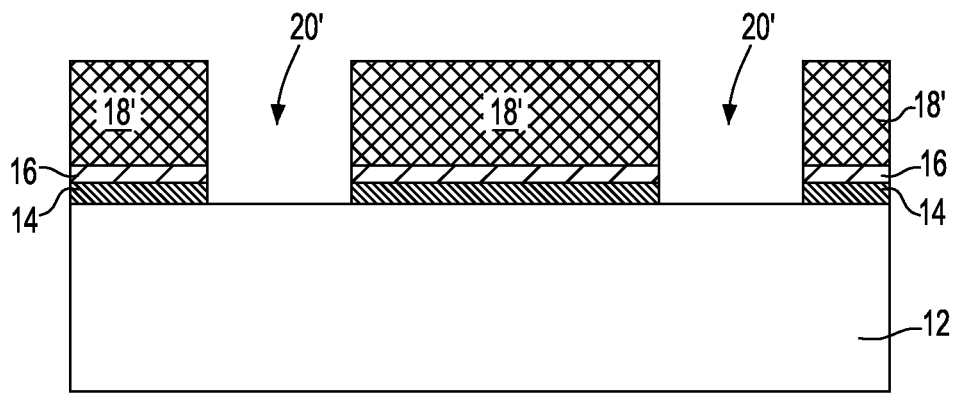
FIG. 4 is a pictorial representation (through a cross sectional view) illustrating the structure of FIG. 3 after transferring the interconnect pattern of the PPLK material into underlying layers that are present within the initial structure.

Referring now to FIG. 4, there is shown the structure of FIG. 3 after transferring the at least one interconnect pattern 20 from the patterned PPLK material 18' through ARC 16 and/or dielectric cap 14. In FIG. 4, reference numeral 20' denotes the extended interconnect pattern that is formed in this step. The transfer of the pattern from the patterned PPLK material 18' into ARC 16 and/or dielectric cap 14 can be performed utilizing dry etching and/or wet etching. Dry etching includes the use of one of reactive ion etching, plasma etching, ion beam etching and laser ablation. Chemical etching utilizing a chemical etchant that selectively removes the exposed portions of ARC 16 and/or dielectric cap 14 relative to the patterned PPLK material 18'.

When the pattern transfer is carried out by reactive ion etching, etching the ARC 16 and/or dielectric cap 14 using the patterned PPLK 18' as the etch mask provides a better etch selectivity than that of the patterned and cured PPLK. Furthermore, the upper portion of the patterned PPLK material 18' can maintain a better sidewall profile, for example, reduced faceting at the top of the PPLK pattern.

Figure 5:
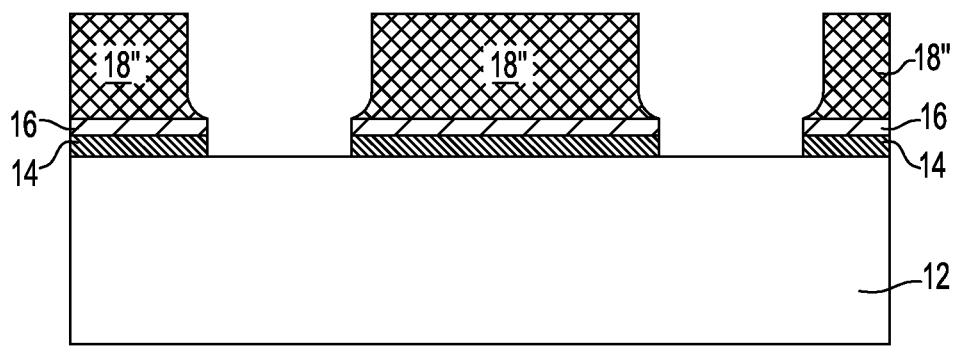
FIG. 5 is a pictorial representation (through a cross sectional view) illustrating the structure of FIG. 4 after performing a curing step which converts the resist-like patterned PPLK material into a patterned and cured low-k material that remains in the structure as a permanent on-chip dielectric. This figure also shows the formation of the inflection point (due to cure induced PPLK material shrinkage) at a lower region of the interconnect pattern that is in proximity to an upper surface of the substrate and the interconnect pattern has an upper region that has substantially straight sidewalls.

Referring now to FIG. 5, there is shown the structure of FIG. 4 after curing the patterned PPLK material 18' into a patterned and cured PPLK material 18''. It is observed that the patterned and cured PPLK material 18'' remains as a permanent low-k interconnect dielectric material within the structure. Curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it converts the patterned PPLK material 18' into a patterned and cured low-k material that maintains pattern fidelity and provides good electrical and mechanical properties. The cured product of patterned PPLK material 18' has a dielectric constant within the range mentioned above.

During the post patterning and etching cure, an inflection point is formed (due to cure induced PPLK material shrinkage) at a lower region of the first interconnect pattern that is in proximity to an upper surface of the substrate and the interconnect pattern has an upper region that has substantially straight sidewalls. This pattern profile of the patterned and cured PPLK 18'' is unique for this integration method.

In one embodiment, the irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 to 300 nm. Additionally, the light of the ultra-violet (UV) cure may be enhanced and/or diffused with a lens or other optical diffusing device known to those skilled in the art.

In another embodiment, this post patterning cure is a combined UV/thermal cure. This combined UV/thermal cure is carried out in a UV/thermal cure module under vacuum or inert atmosphere, such as $N_2$, He, Ar. Typically, the UV/thermal cure temperature is from 100° C. to 500° C., with a cure temperature from 300° to 450° C. being more typical. The duration of the UV/thermal cure is from 0.5 min to 30 min with a duration from 1 to 10 min being more typical. The UV cure module is designed to have a very low oxygen content to avoid degradation of the resultant dielectric materials. This post-patterning and etching cure, if performed, may be in different or the same tool cluster as that of the patterning step.

Although this embodiment illustrates curing of the patterned PPLK material 18' prior to metallization, curing can also be performed during metallization, after metallization or after planarization that follows the metallization process.

Since PPLK curing is performed after transferring of the interconnect pattern, an inflection point is formed (due to cure induced PPLK material shrinkage) at a lower region of the first interconnect pattern that is in proximity to an upper surface of the substrate. Moreover, the width of the cured PPLK material 18'' is increased and the thickness of the cured PPLK material is decreased relative to the PPLK material of a prior integration scheme were curing occurs prior to pattern transfer.

Figure 6:
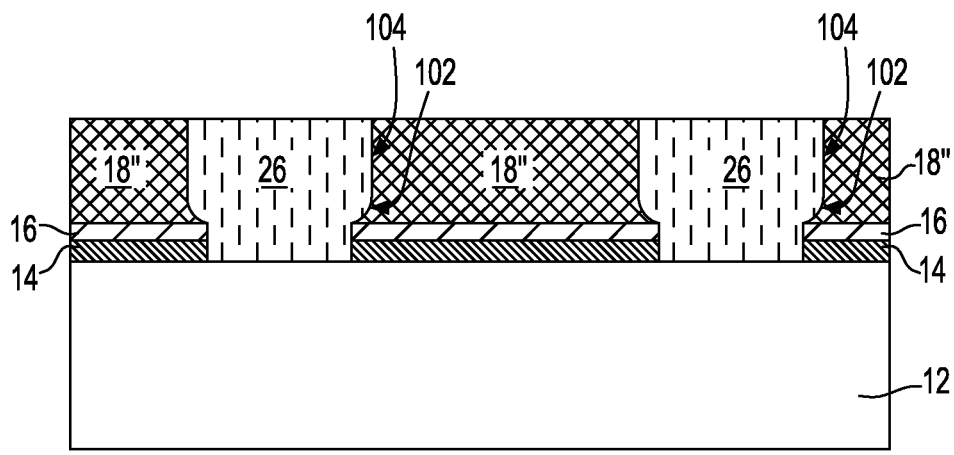
FIG. 6 is a pictorial representation (through a cross sectional view) illustrating the structure of FIG. 5 after filling the at least one interconnect pattern within the patterned and cured low-k material with an electrically conductive material and planarization.
Figure 7:
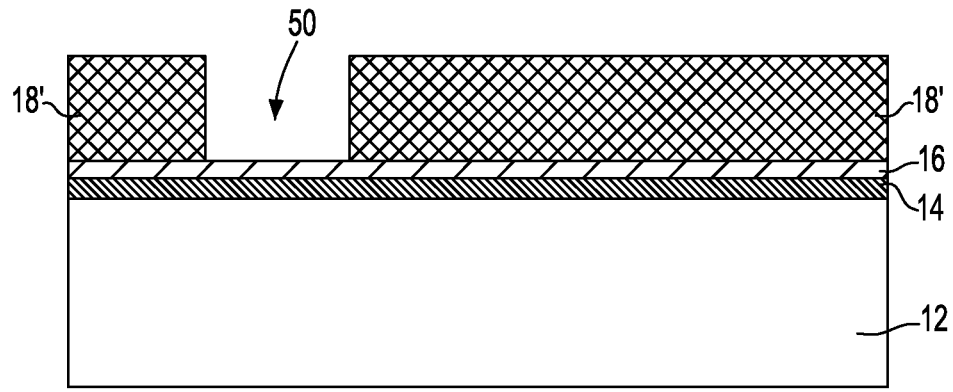
FIG. 7 is a pictorial representation (through a cross sectional view) illustrating the structure of FIG. 2 after forming a first interconnect pattern within the PPLK material, i.e., first PPLK material, in accordance with another embodiment of the invention.

Referring to FIG. 6, there is illustrated the structure of FIG. 5 after filling the at least one extended interconnect pattern 20' with an electrically conductive material 26 and planarization. In some embodiments, a diffusion barrier (not shown), which may comprise Ta, TaN, Ti, TiN, Ru, RuTaN, RuTa, W, WN or any other material that can serve as a barrier to prevent electrically conductive material from diffusing through, is typically formed into the extended interconnect pattern 20' prior to filling the same with the electrically conductive material 26. The diffusion bather can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier may comprise a combination of layers. The thickness of the diffusion barrier may vary depending on the exact means of the deposition process employed as well as the material and number of layers employed. Typically, the diffusion barrier has a thickness from 4 to 40 nm, with a thickness from 7 to 20 nm being more typical.

Following the formation of the diffusion barrier, the remaining region of the at least one extended interconnect pattern 20' is filled with an electrically conductive material 26 forming a conductive feature. The electrically conductive material 26 used in forming the conductive feature includes, for example, polySi, an electrically conductive metal, an alloy comprising at least one electrically conductive metal, an electrically conductive metal silicide, an electrically conductive nanotube or nanowire, graphene or combinations thereof. Preferably, the electrically conductive material 26 that is used in forming the conductive feature is a conductive metal such as Cu, W or Al, with Cu or a Cu alloy (such as AlCu) being highly preferred in the present invention. The electrically conductive material 26 is filled into the remaining at least one interconnect pattern utilizing a conventional deposition process including, but not limited to, CVD, PECVD, sputtering, chemical solution deposition or plating. A preferred filling method is electrochemical plating.

After deposition, a conventional planarization process such as, for example, chemical mechanical polishing (CMP) can be used to provide a structure in which the diffusion barrier layer and the electrically conductive material 26 each have an upper surface that is substantially coplanar with the upper surface of the patterned and cured PPLK material 18''. The resultant structure after filling the interconnect patterns and planarization is shown, for example, in FIG. 6.

A dielectric cap such as described above can be formed atop the structure shown in FIG. 6. In some embodiments, the above process can be repeated any number of times to provide a multilevel single damascene interconnect structure.

It is observed that in FIG. 6 there is shown an interconnect structure including at least one conductively filled region (e.g., region 26) located within a patterned and cured PPLK material (e.g., material 18'') that has an inflection point 102 at a lower region of an interconnect pattern 20 that is in proximity to an upper surface of a substrate 10 underlying the patterned and cured PPLK material 18". The interconnect pattern 20 also includes an upper region 104 that has substantially straight sidewalls. The substantially straight sidewalls are in direct contact with an edge of the inflection point 102.

It is observed that the above description that relates to FIGS. 1-6 illustrates one embodiment of the invention in which a single damascene interconnect structure is formed. The following description which refers to FIGS. 7-11 illustrates another embodiment of the invention in which a dual damascene interconnect structure is formed. This embodiment begins by first providing the structure shown in FIG. 2. Next, and referring to FIG. 7, there is shown the structure of FIG. 2 after forming at least one first interconnect pattern 50 within the PPLK material, which represents a first PPLK material for this embodiment of the invention. The at least one first interconnect pattern 50 includes one of the openings mentioned above for the at least one interconnect pattern 20 and the at least one interconnect pattern 50 can be formed as described above for forming interconnect pattern 20 shown in FIG. 3.

Figure 8:
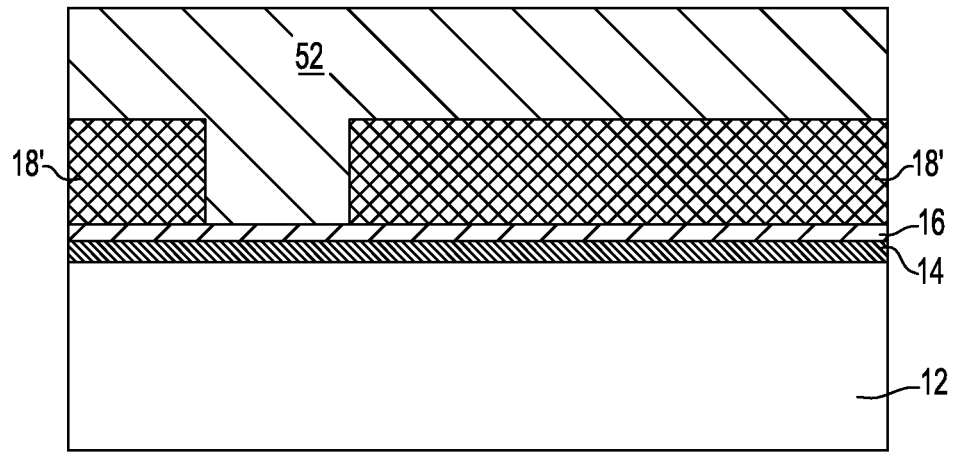
FIG. 8 is a pictorial representation (through a cross sectional view) illustrating the structure of FIG. 7 after a freeze step and forming a second PPLK material thereon.

A second PPLK material 52 is formed after freezing the first patterned PPLK material 18' providing the structure shown in FIG. 8. In FIG. 8, the second PPLK material 52 is formed within the at least one first interconnect pattern 50 and extends onto an upper surface of the first patterned PPLK material 18'. The second PPLK material 52 can comprise the same or different material as the first PPLK material 18. In general terms, the nature, the composition, and the method of formulation mentioned above for the first PPLK material 18 are each applicable here for the second PPLK material 52. The deposition processes and thickness mentioned above for the first PPLK material 18 are also each applicable here for the second PPLK material 52. Typically, and in the embodiment illustrated, the first PPLK material 18 or the second PPLK material 52 is either a negative-tone or a positive-tone PPLK material.

Figure 9:
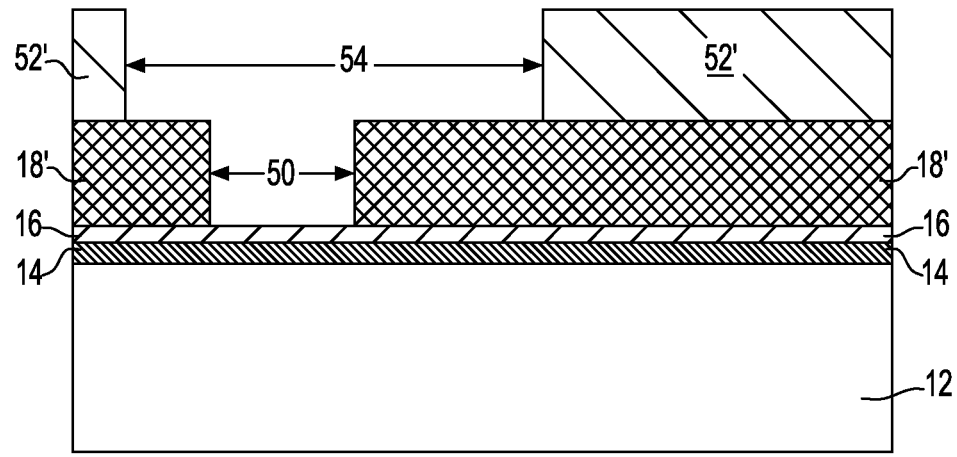
FIG. 9 is a pictorial representation (through a cross sectional view) illustrating the structure of FIG. 8 after forming a second interconnect pattern within the second PPLK material.

Referring now to FIG. 9, there is illustrated the structure of FIG. 8 after forming at least one second interconnect pattern 54 within the second PPLK material 52 and recovering the first interconnect pattern 50. The patterning of the second PPLK material 52 into patterned second PPLK material 52' is performed utilizing the same basic processing equipment, steps and conditions as those used for patterning the first PPLK material 18. In the illustrated embodiment, the second interconnect pattern 54 is typically a line (trench). The via pattern formed within the first PPLK material 18 and subsequently filled when the second PPLK material 52 is also recovered. The second interconnect pattern 54 may also be a via, when the first interconnect pattern 50 is a line.

Figure 10:
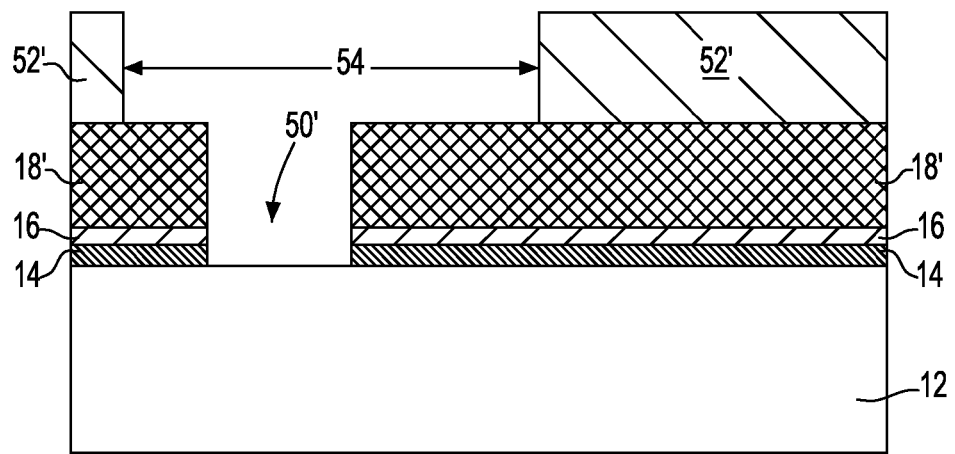
FIG. 10 is a pictorial representation (through a cross sectional view) illustrating the structure of FIG. 9 after transferring the first interconnect pattern from the first PPLK material into underlying layers of the initial structure.

Referring now to FIG. 10, there is shown the structure of FIG. 9 after optionally transferring the first interconnect pattern within the first patterned PPLK material 18' into the ARC 16 and/or dielectric cap 14. The pattern transfer into ARC 16 and/or dielectric cap 14 is achieved utilizing one of the etching steps mentioned above in the first embodiment.

Figure 11:
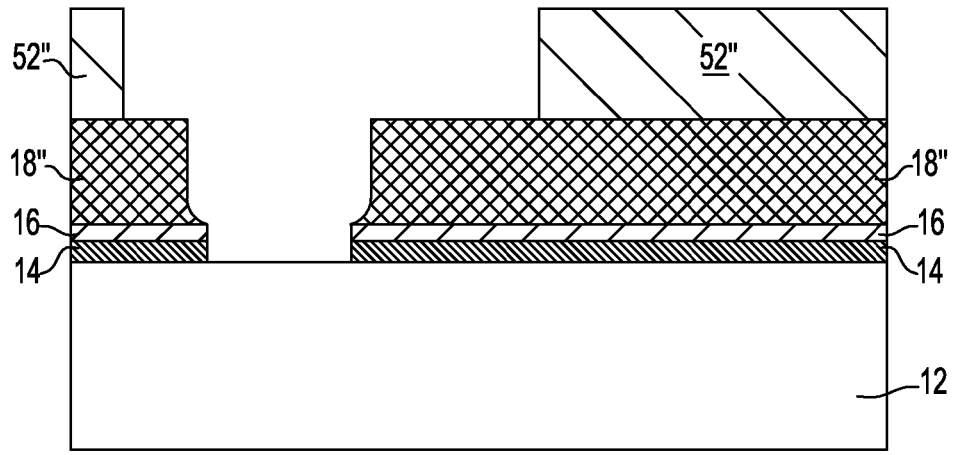
FIG. 11 is a pictorial representation (through a cross sectional view) illustrating the structure of FIG. 10 after performing a curing step that converts the patterned first and second PPLK materials into patterned and cured low-k materials that remain in the structure as permanent interconnect dielectrics. This figure also shows the formation of the inflection point (due to cure induced PPLK material shrinkage) at a lower region of the first interconnect pattern that is in proximity to an upper surface of the substrate and the interconnect pattern has an upper region that has substantially straight sidewalls.

Referring now to FIG. 11, there is shown the structure of FIG. 10 after a curing step is performed. It is again observed that this curing step can be performed during metallization, after metallization or after a planarization process that follows metallization. The curing step converts the patterned PPLK materials into a patterned and cured PPLK reaction products. The cured PPLK of the patterned first and second patterned dielectric materials are labeled as elements 18" and 52", respectively within FIG. 11. The patterned and cured PPLK materials 18" and 52" remain within the structure as permanent low-k dielectric materials for the interconnect structure. The curing includes one of the curing processes mentioned above in the first embodiment of the invention.

After the cure process, an inflection point is formed (due to cure induced PPLK material shrinkage) at a lower region of the first interconnect pattern that is in proximity to an upper surface of the substrate and the interconnect pattern has an upper region that has substantially straight sidewalls. This pattern profile of the patterned and cured PPLK 18" is unique for this inventive integration method.

Figure 12:
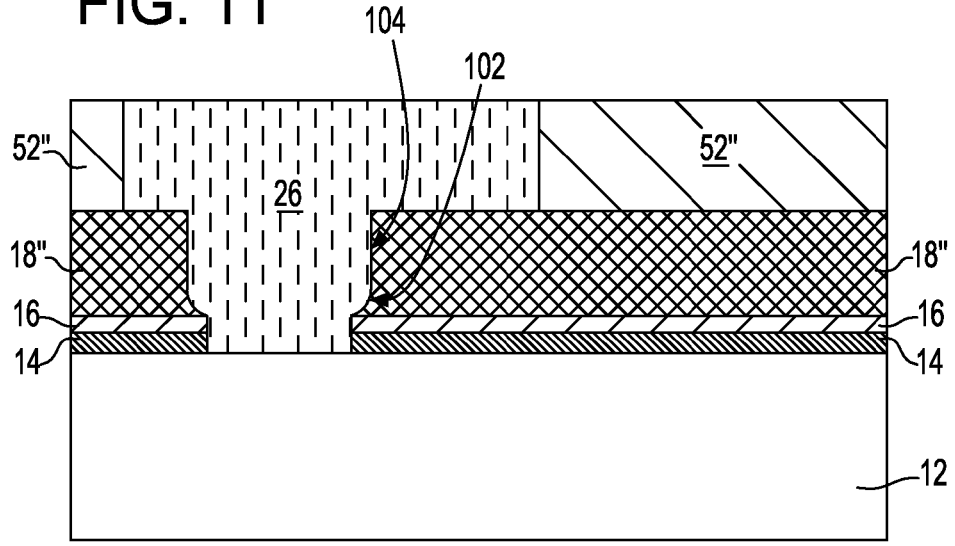
FIG. 12 is a pictorial representation (through a cross sectional view) illustrating the structure of FIG. 11 after filling the interconnect patterns within the patterned and cured first and second low-k materials with an electrically conductive material and planarization.

Referring now to FIG. 12, there is shown the structure of FIG. 11 after filling the interconnect patterns within at least the patterned and cured PPLK materials 18" and 52" with an electrically conductive material 26 and planarization. The processing and materials used in forming the structure shown in FIG. 12 are identical to those mentioned above in forming the structure shown in FIG. 6 of the first embodiment of the invention. Moreover, the method provides a dual damascene interconnect structure including at least one conductively filled region (e.g., region 26) located within a patterned and cured PPLK material (e.g., material 18") that has an inflection point 102 at a lower region of an interconnect pattern that is in proximity to an upper surface of a substrate 10 underlying the patterned and cured reaction product of the PPLK material 18". The interconnect pattern 20 also includes an upper region 104 that has substantially straight sidewalls. The substantially straight sidewalls are in direct contact with an edge of the inflection point 102.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    providing at least one photo-patternable low-k (PPLK) material an upper surface of a substrate;
    forming at least one interconnect pattern into the at least one PPLK material providing at least one patterned PPLK material, wherein said forming the at least one interconnect pattern is performed without utilizing a separate photoresist;
    transferring the at least one interconnect pattern from the at least one patterned PPLK material into a portion of said substrate; and
    curing the at least one patterned PPLK material, wherein said curing induces shrinkage of the at least one patterned PPLK material forming a patterned and cured PPLK material that has a bottom sidewall profile at a bottom portion of the patterned and cured PPLK material that exhibits a change in curvature and an upper sidewall profile at an upper portion of the patterned and cured PPLK material that is substantially straight, wherein said patterned and cured PPLK material remains as a permanent interconnect dielectric material.

2. The method of claim 1 wherein said at least one PPLK material includes a functionalized polymer, copolymer or blend including at least two of any combination of polymers and/or copolymers having one or more acid-sensitive imageable groups.

3. he method of claim 1 wherein said substrate includes an antireflective coating and said at least one PPLK material is formed on an upper surface of the antireflective coating.

4. The method of claim 1 wherein said substrate includes a dielectric cap and said at least one PPLK material is formed on an upper surface of the dielectric cap.

5. The method of claim 1 wherein said substrate includes a material stack of a dielectric cap and an overlying antireflective coating as separate layers or as a single layer.

6. The method of claim 1 wherein said forming at least one interconnect pattern includes pattern-wise exposure through a mask with G-line exposure, I-line exposure, DUV exposure, EUV exposure, or direct write patterning, imprint contact printing, inkjet printing, screen printing or multi-patterning lithography.

7. The method of claim 1 wherein said transferring includes selective reactive ion etching, plasma etching, cluster gas ion etching or chemical etching.

8. The method of claim 1 wherein said curing comprises a thermal cure, an electron beam cure, an ultra-violet (UV) cure, an ion beam cure, a plasma cure, a microwave cure or a combination thereof.

9. The method of claim 1 wherein said curing is performed after patterning and before metallization.

10. The method of claim 9 wherein said metallization includes filling said at least one interconnect pattern with an electrically conductive material.

11. The method of claim 1 wherein said curing is performed during metallization, after metallization or after metallization and planarization.

12. The method of claim 1 wherein said bottom sidewall profile and said upper sidewall profile of said patterned and cured PPLK material are not vertical coincident with sidewalls of said at least one interconnect pattern that was transferred into said portion of said substrate.

13. A method of forming a semiconductor structure comprising:
 forming a first photo-patternable low-k (PPLK) material on an upper surface of a substrate;
 forming at least one first interconnect pattern into the first PPLK material providing a first patterned PPLK material;
 forming a second PPLK material within the at least one first interconnect pattern and atop the first patterned PPLK material;
 forming at least one second interconnect pattern within the second PPLK material providing a second patterned PPLK material;
 transferring at least the first interconnect pattern into at least a portion of the substrate; and
 curing said first patterned PPLK material and the second patterned PPLK material into first and second patterned and cured PPLK materials, respectively, wherein said first and second patterned and cured PPLK materials remain as permanent on-chip interconnect dielectric materials, and wherein said curing induces shrinkage of the first patterned PPLK material providing said first patterned and cured PPLK material that has a bottom sidewall profile at a bottom portion of the first patterned and cured PPLK material that exhibits a change in curvature and an upper sidewall profile at an upper portion of the first patterned and cured PPLK material that is substantially straight.

14. The method of claim 13 wherein said first and second PPLK materials are the same or different and are selected from a functionalized polymer, copolymer or blend including at least two of any combination of polymers and/or copolymers having one or more acid-sensitive imageable groups.

15. The method of claim 13 wherein said substrate includes an antireflective coating and said first PPLK material is formed on an upper surface of the antireflective coating.

16. The method of claim 13 wherein said substrate includes a dielectric cap and said first PPLK material is formed on an upper surface of the dielectric cap.

17. The method of claim 13 wherein said substrate includes a material stack of a dielectric cap and an overlying antireflective coating as separate layers or as a single layer.

18. The method of claim 13 wherein said forming said first and second interconnect patterns includes pattern-wise exposure through a mask with G-line exposure, I-line exposure, DUV exposure, EUV exposure, direct write patterning, imprint contact printing, inkjet printing, screen printing or multi-patterning lithography.

19. The method of claim 13 wherein said curing comprises a thermal cure, an electron beam cure, an ultra-violet (UV) cure, an ion beam cure, a plasma cure, a microwave cure or a combination thereof.

20. The method of claim 13 wherein said curing is performed after patterning and before metallization.

21. The method of claim 20 wherein said metallization includes filling said at least one interconnect pattern with an electrically conductive material.

22. The method of claim 13 further comprising freezing the at least one first interconnect pattern into the first patterned PPLK material prior to forming the second PPLK material.

23. The method of claim 13 wherein said curing is performed during metallization, after metallization or after metallization and planarization.

24. The method of claim 13 wherein said bottom sidewall profile and said upper sidewall profile of said first patterned and cured PPLK material are not vertical coincident with sidewalls of said at least one interconnect pattern that was transferred into said portion of said substrate.

* * * * *